United States Patent
Lee et al.

(10) Patent No.: US 7,508,680 B2
(45) Date of Patent: Mar. 24, 2009

(54) ADJUSTABLE-INDUCTANCE FILTER, TAPE DISTRIBUTION SUBSTRATE COMPRISING THE FILTER, AND DISPLAY PANEL ASSEMBLY COMPRISING THE TAPE DISTRIBUTION SUBSTRATE

(75) Inventors: Hee-seok Lee, Yongin-si (KR);
Yun-seok Choi, Hwaseong-si (KR);
Eun-seok Song, Gwanak-gu (KR);
Young-sang Cho, Suwon-si (KR);
Na-rae Shin, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/779,324

(22) Filed: Jul. 18, 2007

(65) Prior Publication Data
US 2008/0018390 A1 Jan. 24, 2008

(30) Foreign Application Priority Data
Jul. 18, 2006 (KR) .................. 10-2006-0067101

(51) Int. Cl.
*H05K 1/16* (2006.01)
*H01F 27/28* (2006.01)
*H01L 23/48* (2006.01)

(52) U.S. Cl. .................. 361/765; 336/180; 257/693
(58) Field of Classification Search ................ 361/765; 336/180; 257/693
See application file for complete search history.

(56) References Cited

U.S. PATENT DOCUMENTS 4,494,100 A * 1/1985 Stengel et al. ............. 336/200
5,239,289 A * 8/1993 Ferraiolo et al. ............ 336/180

FOREIGN PATENT DOCUMENTS

| JP | 2006100664 | 4/2006 |
| KR | 1020040023995 A | 3/2004 |
| KR | 1020040032509 A | 4/2004 |

* cited by examiner

*Primary Examiner*—Evan Pert
(74) *Attorney, Agent, or Firm*—Volentine & Whitt, PLLC

(57) ABSTRACT

An adjustable-inductance (AI) filter, a tape distribution substrate including the filter, and a display panel assembly including the tape distribution substrate are provided. The adjustable-inductance (AI) filter includes a filter distribution line including first and second end portions each having a first line width, at least one repair pattern having a second line width and disposed between the first and second end portions, and at least one unit filter bank connected in parallel to the at least one repair pattern, respectively.

26 Claims, 8 Drawing Sheets

ADJUSTABLE-INDUCTANCE FILTER, TAPE DISTRIBUTION SUBSTRATE COMPRISING THE FILTER, AND DISPLAY PANEL ASSEMBLY COMPRISING THE TAPE DISTRIBUTION SUBSTRATE

CROSS-REFERENCE TO RELATED APPLICATION

This application claims priority to Korean Patent Application No. 10-2006-0067101, filed on Jul. 18, 2006, the subject matter of which is hereby incorporated by reference in its entirety.

BACKGROUND OF THE INVENTION

1. Field of the Invention

Embodiments of the invention relate to an adjustable-inductance (AI) filter, a tape distribution substrate comprising the AI filter, and a display panel assembly comprising the tape distribution substrate. In particular, embodiments of the invention relate to an AI filter comprising at least one repair pattern and at least one unit filter bank, a tape distribution substrate comprising the AI filter, and a display panel assembly comprising the tape distribution substrate.

2. Description of the Related Art

Currently, electronic devices such as mobile phones and portable computers are being produced to be relatively small, thin, and light. Accordingly, relatively small and light chips having relatively high performance and relatively high integration density are mounted in those electronic devices. In general, a display panel assembly includes a display panel, a printed circuit board (PCB), and a tape distribution substrate connecting the display panel to the PCB to provide driving signals from the PCB to the display panel. Examples of conventional tape distribution substrates include gate tape distribution substrates that connect the display panel and a gate PCB and source tape distribution substrates that connect the display panel and a source PCB.

The tape distribution substrate has a structure in which distribution lines, and leads connected to the distribution lines, are disposed on an insulating film such as a polyimide, and a semiconductor chip (i.e., a driving integrated circuit (IC)) is mounted on a chip mounting portion of the insulating film. Bumps formed on the semiconductor chip before it is mounted are integrally bonded to the leads of the tape distribution substrate in order to mount the semiconductor chip on the tape distribution substrate. The semiconductor chip radiates electronic waves, and the semiconductor chip is connected to the PCB and the display panel (which acts as an antenna of the display panel assembly) through the tape distribution substrate.

Thus, it is important to reduce electromagnetic interference (EMI) in the display panel assembly. A conventional method for reducing the EMI on a PCB is to insert a ferrite core, an inductor, or a capacitor at a system board level; however, such methods increase fabrication costs. Another method is to insert a filter for filtering radio frequency noise generated by the semiconductor chip onto the tape distribution substrate. However, using that method requires inserting a discrete component for filtering the radio frequency noise onto the tape distribution substrate. Therefore, the size of a corresponding package increases, and fabrication costs increase.

SUMMARY OF THE INVENTION

Embodiments of the invention provide a adjustable-inductance (AI) filter, wherein the inductance of the AI filter may be adjusted, a tape distribution substrate comprising the AI filter, and a display panel assembly comprising the tape distribution substrate.

In one embodiment, the invention provides an adjustable-inductance (AI) filter comprising a filter distribution line comprising first and second end portions each having a first line width, at least one repair pattern having a second line width and disposed between the first and second end portions, and at least one unit filter bank connected in parallel to the at least one repair pattern, respectively.

In another embodiment, the invention provides a tape distribution substrate comprising a base film comprising a chip mounting portion, a semiconductor chip mounted on the chip mounting portion, distribution patterns disposed on the base film, and an adjustable-inductance (AI) filter disposed on the base film and disposed adjacent to at least one of the distribution patterns. The AI filter comprises a filter distribution line comprising first and second end portions each having a first line width, a repair portion disposed between the first and second end portions, and a filter bank portion connected to the first and second end portions.

In yet another embodiment, the invention provides a display panel assembly comprising a display panel displaying images, a printed circuit board supplying driving signals to the display panel, and a tape distribution substrate connected between the printed circuit board and the display panel and comprising an adjustable-inductance (AI) filter. The AI filter comprises a filter distribution line comprising first and second end portions each having a first line width, at least one repair pattern having a second line width and disposed between the first and second end portions, and at least one unit filter bank connected in parallel to the at least one repair pattern, respectively.

BRIEF DESCRIPTION OF THE DRAWINGS

Embodiments of the invention will be described herein with reference to the accompanying drawings, in which.

DESCRIPTION OF EMBODIMENTS

Figure 1:
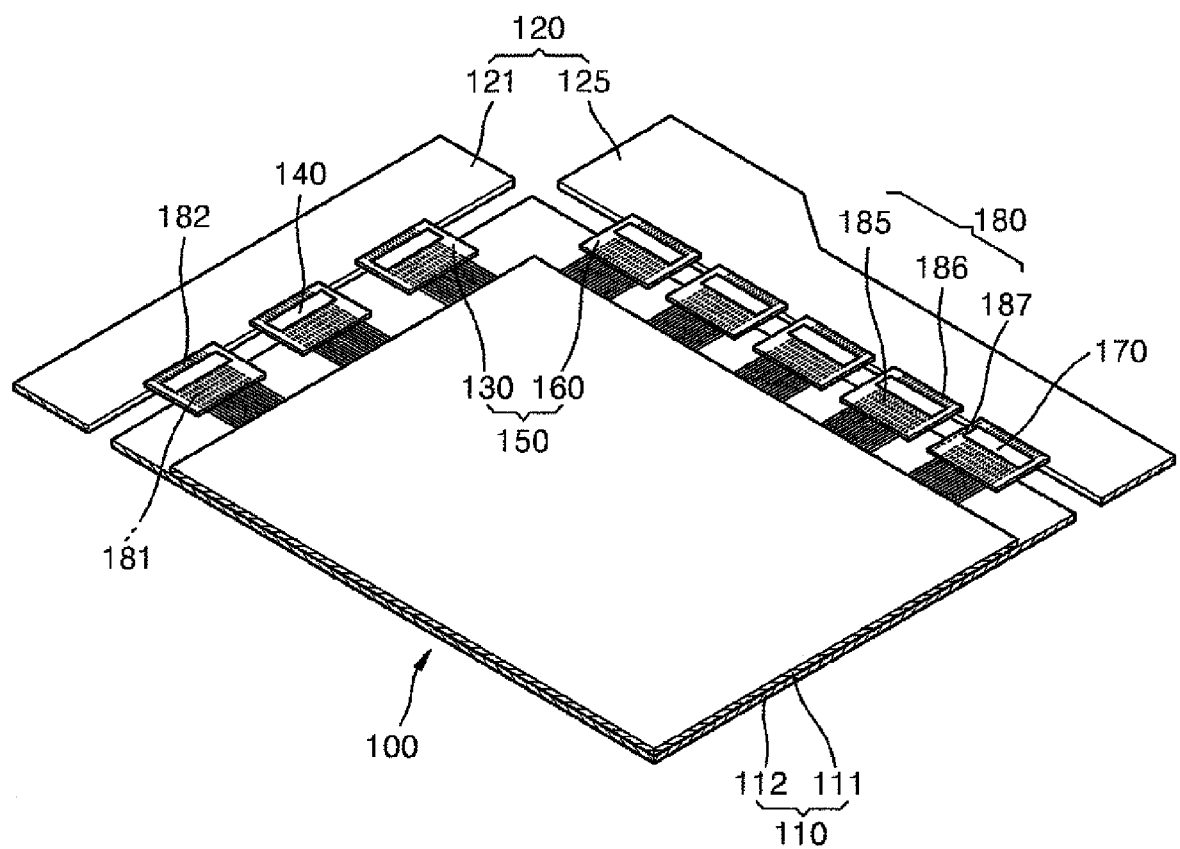
FIG. 1 is a schematic block diagram of a display panel assembly in accordance with an embodiment of the invention.

In the drawings, the thicknesses of layers and regions may not be drawn to scale. In addition, in the drawings, like reference symbols indicate like elements throughout, so it may be that only one of multiple elements indicated by a like reference symbol is described herein.

FIG. 1 is a schematic block diagram of a display panel assembly 100 in accordance with an embodiment of the invention. Display panel assembly 100 may be a thin film transistor-liquid crystal display (TFT-LCD), a plasma display panel (PDP), an organic light emitting diode (OLED), or a field emission display (FED), but embodiments of the invention are not limited to only those examples. In the embodiment illustrated in FIG. 1, display panel assembly 100 is a TFT-LCD.

Referring to FIG. 1, display panel assembly 100 comprises a display panel 110, printed circuit boards (PCBs) 120, and a plurality of tape distribution substrates 150 connecting display panel 110 to PCBs 120. Display panel 110 comprises a lower substrate 112 and an upper substrate 111 facing lower substrate 112. Although it is not shown in the drawings, lower substrate 112 may comprise a pixel array in which unit pixels are arranged in a matrix, wherein each unit pixel comprises a thin film transistor (TFT) connected to a gate line and a data line and a pixel electrode connected to the TFT. A color filter and common electrodes can be formed on upper substrate 111. Display panel 110 comprises a liquid crystal material (not shown) disposed between upper and lower substrates 111 and 112. Components disposed on upper and lower substrates 111 and 112 are not limited to only the exemplary components described above, and the collection of components disposed on upper and lower substrates 111 and 112 may vary in accordance with the method used to drive the display device.

PCBs 120 comprise a gate PCB 121 that provides display panel 110 with gate driving signals, and a source PCB 125 that provides display panel 110 with data driving signals. Gate PCB 121 provides the gate driving signals for driving the TFTs disposed on display panel 110 to display panel 110, and source PCB 125 provides the data driving signals for driving the TFTs disposed on display panel 110 to display panel 110.

In the embodiment illustrated in FIG. 1, PCBs 120 are separated into gate PCB 121 and source PCB 125; however, embodiments of the invention are not limited only to PCBs 120 being separated into gate PCB 121 and source PCB 125. For example, PCBs 120 may be an integrated PCB 120 formed by integrating gate PCB 121 and source PCB 125, wherein the integrated PCB 120 comprises a plurality of driving devices that are semiconductor chips designed using one-chip circuit technology. The driving devices provide semiconductor chips 140 mounted on gate tape distribution substrates 130 with the gate driving signals for driving the TFTs disposed on display panel 110, and provide semiconductor chips 170 mounted on source tape distribution substrates 160 with the data driving signals for driving the TFTs disposed on display panel 110.

The plurality of tape distribution substrates 150 comprises a plurality of gate tape distribution substrates 130 that electrically connect gate PCB 121 in a block to display panel 110, and a plurality of source tape distribution substrates 160 that electrically connect source PCB 125 to display panel 110. Each tape distribution substrate 150 may comprise a flexible printed circuit board (FPCB), such as a chip on film (COF), in which distribution patterns are formed on a base film. So that distribution patterns formed on an insulating base film such as a polyimide may be bonded to terminals (i.e., conductive bumps) that were previously formed on a semiconductor chip to be mounted on the insulating base film (i.e., a semiconductor chip 140 or 170), each tape distribution substrate 150 may comprise a type of tape distribution substrate used in a tape automated bonding (TAB) technology.

A semiconductor chip 140 that provides gate driving signals to TFTs of display panel 110 is mounted on each gate tape distribution substrate 130, and PCB 121 supplies the gate driving signals to semiconductor chips 140 mounted on gate tape distribution substrates 130. Each semiconductor chip 140 receives gate driving signals and then provides the gate driving signals to at least one TFT disposed on display panel 110 through at least one gate line. Each semiconductor chip 140 is electrically connected to gate PCB 121 through input distribution lines 186 and is electrically connected to display panel 110 through output distribution lines 185. In addition, a semiconductor chip 170 is mounted on each of source tape distribution substrates 160. Each semiconductor chip 170 is electrically connected to source PCB 125 through input distribution lines 186 and is electrically connected to display panel 110 through output distribution lines 185.

Figure 2:
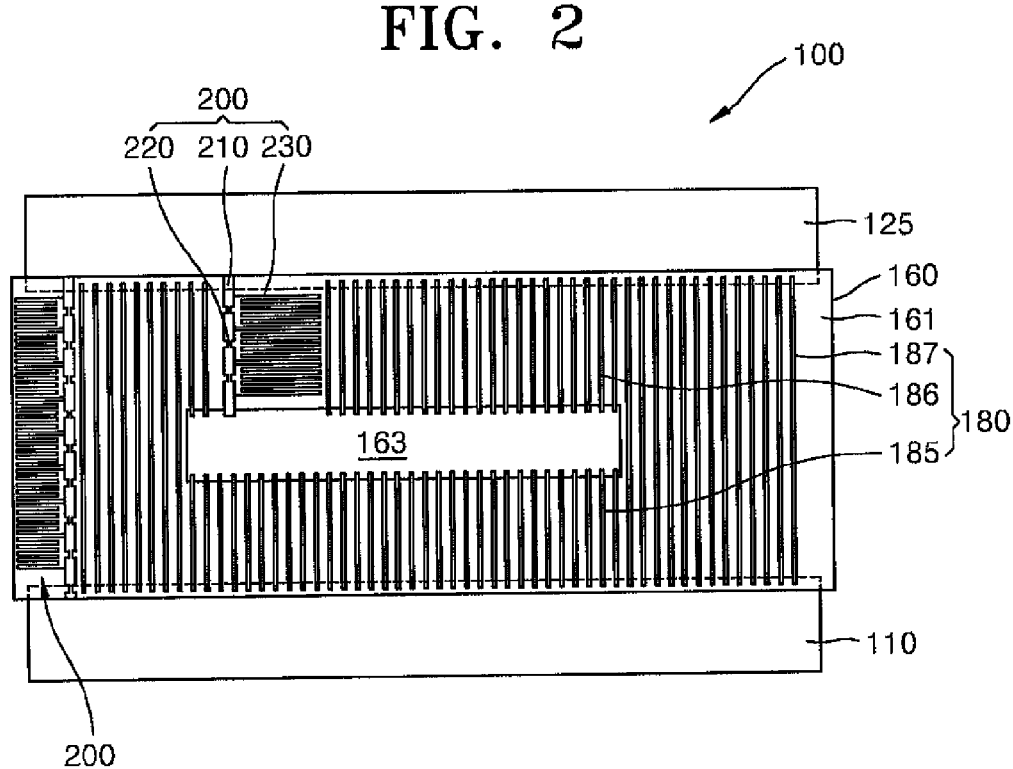
FIG. 2 is a plan view of a portion of the display panel assembly of FIG. 1 comprising a source tape distribution substrate comprising an adjustable-inductance (AI) filter in accordance with an embodiment of the invention.

FIG. 2 is a plan view of a portion of display panel assembly 100. FIG. 2 illustrates a source tape distribution substrate 160 of tape distribution substrates 150 of display panel assembly 100 of FIG. 1.

Referring to FIG. 2, source tape distribution substrate 160 comprises a base film 161 comprising a chip mounting portion 163 where a semiconductor chip 170 may be mounted (i.e., chip mounting portion 163 is adapted to receive a semiconductor chip 170 mounted on chip mounting portion 163). Source tape distribution substrate 160 further comprises distribution patterns 180 disposed on base film 161. Distribution patterns 180 comprise a plurality of input distribution lines 186 connected to input terminals (not shown in FIG. 2) of semiconductor chip 170, a plurality of output distribution lines 185 connected to output terminals (not shown in FIG. 2) of semiconductor chip 170, and a plurality of bypass distribution lines 187. Distribution patterns 180 may further comprise a plurality of dummy patterns.

Input distribution lines 186 electrically connect source PCB 125 to input terminals of semiconductor chip 170, and output distribution lines 185 electrically connect output terminals of semiconductor chip 170 to display panel 110. Bypass distribution lines 187 electrically connect source PCB 125 to display panel 110 and are not connected to input terminals or output terminals of semiconductor chip 170.

Source tape distribution substrate 160 further comprises an adjustable-inductance (AI) filter 200 disposed on base film 161. Any AI filter may be referred to herein simply as a "filter". In addition, an AI filter may be referred to as a repairable and scalable electromagnetic interference (EMI) reduction filter. In addition, as used herein, the word "repair" and other forms thereof connote adjustment of the inductance of an AI filter in order to improve the EMI level of a component or device comprising the AI filter.

In the embodiment illustrated in FIG. 2, source tape distribution substrate 160 comprises a first filter 200 and a second filter 200. Source tape distribution substrate 160 comprises first filter 200 (i.e., first filter 200 is built into source tape distribution substrate 160) so that EMI of display panel assembly 100 may be reduced. In addition, first filter 200 may be disposed adjacent to distribution patterns 180. That is, first filter 200 may be disposed adjacent to one or more distribution lines among the plurality of input distribution lines 186, the plurality of output distribution lines 185, and the plurality of bypass distribution lines 187. In addition, when distribution patterns 180 comprise the plurality of dummy patterns, first filter 200 can be disposed adjacent to one or more dummy patterns among the plurality of dummy patterns.

First filter 200 comprises a filter distribution line 210 having a first end portion 211 (see FIG. 3) connected to source PCB 125 and a second end portion 212 (see FIG. 3) connected to semiconductor chip 170 or display panel 110. First filter 200 further comprises a repair portion 220 disposed between first and second end portions 211 and 212 of filter distribution line 210, and a filter bank portion 230 connected to filter distribution line 210, wherein filter bank portion 230 and repair portion 220 may be used together to adjust the inductance of first filter 200.

Although it is not shown in the drawings, base film 161 is covered by a protective film such as a solder resist. The protective film is formed over substantially all of base film 161 except for chip mounting portion 163; end portions of distribution lines 185, 186, and 187 making contact with one of PCBs 120 (i.e., source PCB 125) or display panel 110, or making contact with semiconductor chip 170 once mounted; repair portion 220 of first filter 200; and end portions of filter distribution line 210. Semiconductor chip 170 may be electrically connected to end portions of input distribution lines 186 and output distribution lines 185 exposed by the protective film through terminals (i.e., conductive bumps) formed on semiconductor chip 170. The terminals are formed on semiconductor chip 170 before it is mounted on base film 161.

In the embodiment illustrated in FIG. 2, first filter 200 is disposed adjacent to input distribution lines 186 and second filter 200 is disposed adjacent to bypass distribution lines 187. However, one of the filters 200 illustrated in FIG. 2 may alternatively be disposed adjacent to output distribution lines 185. In addition, a plurality of filters 200 may be disposed on some of the plurality of input distribution lines 186, some of the plurality of bypass distribution lines 187, and some of the plurality of output distribution lines 185. The number of filters 200 that source tape distribution substrate 160 comprises and the respective positions where those filters 200 are disposed can be chosen so that filters 200 reduce the level of EMI generated by display panel assembly 100 and satisfy the driving properties of semiconductor chip 170.

Likewise, gate tape distribution substrate 130 comprises a base film having a chip mounting portion where a semiconductor chip 140 may be mounted (i.e., the chip mounting portion is adapted to receive a semiconductor chip 140 mounted on the chip mounting portion). Gate tape distribution substrate 130 further comprises distribution patterns disposed on the base film. The distribution patterns comprise a plurality of input distribution lines 186 connected to input terminals (not shown) of semiconductor chip 140, a plurality of output distribution lines 185 connected to output terminals (not shown) of semiconductor chip 140, and a plurality of bypass distribution lines. The distribution patterns may further comprise a plurality of dummy patterns.

Input distribution lines 186 electrically connect gate PCB 121 to the input terminals of semiconductor chip 140, and output distribution lines 185 electrically connect the output terminals of semiconductor chip 140 to display panel 110. The bypass distribution lines electrically connect gate PCB 121 to display panel 110 and are not connected to the input terminals or the output terminals of semiconductor chip 140.

Gate tape distribution substrate 130 may further comprise an Al filter 200 (see filter 200 of FIG. 2) disposed on the base film. Filter 200 may be disposed adjacent to one or more distribution lines among the plurality of input distribution lines 186, the plurality of output distribution lines 185, and the plurality of bypass distribution lines. In addition, when the plurality of dummy patterns is disposed on the base film, filter 200 may be disposed adjacent to one or more dummy patterns among the plurality of dummy patterns. Filter 200 may comprise a filter distribution line having a first end portion connected to gate PCB 121 and a second end portion connected to semiconductor chip 140 or display panel 110. Filter 200 may further comprise a repair portion disposed between the first and second end portions of the filter distribution line, and a filter bank portion connected to the filter distribution line, wherein the filter bank portion and the repair portion may be used together to adjust the inductance of filter 200.

Figure 3:
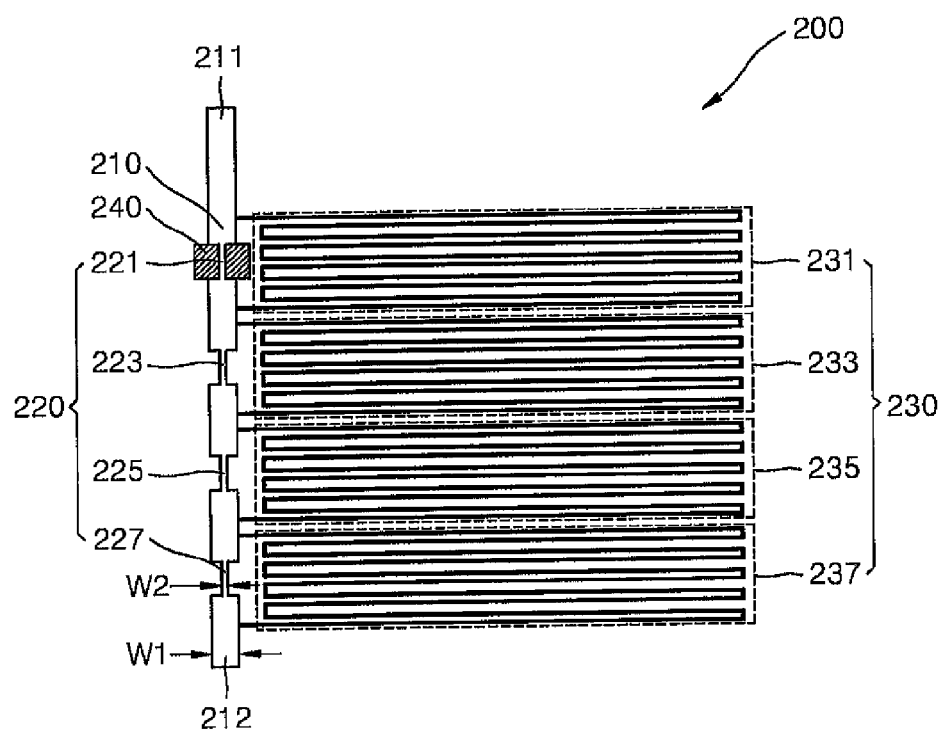
FIG. 3 is a plan view of the AI filter of FIG. 2 in accordance with an embodiment of the invention.

FIG. 3 is a plan view of first filter 200 of FIG. 2. Referring to FIG. 3, filter 200 comprises filter distribution line 210, repair portion 220, and filter bank portion 230. Filter distribution line 210 comprises first and second end portions 211 and 212. Repair portion 220 is disposed between first and second end portions 211 and 212 of filter distribution line 210 and comprises repair patterns 221, 223, 225, and 227. At least portions of filter distribution line 210 have a first line width W1. That is, at least the portions of filter distribution line 210 other than repair patterns 221, 223, 225, and 227 have first line width W1. Repair patterns 221, 223, 225, and 227 each have a second line width W2. So, in the embodiment illustrated in FIG. 3, unless second line width W2 is equal to first line width W1, all portions of filter distribution line 210 except for repair patterns 221, 223, 225, and 227 have first line width W1. Filter bank portion 230 comprises unit filter banks 231, 233, 235, and 237, which are each connected to filter distribution line 210. Each of unit filter banks 231, 233, 235, and 237 is connected to (i.e., connected electrically between) a respective two portions of filter distribution line 210 separated by one of repair patterns 221, 223, 225, and 227. In addition, unit filter banks 231, 233, 235, and 237 are connected in parallel to repair patterns 221, 223, 225, and 227, respectively. For example, unit filter bank 231 is connected to each of two portions of filter distribution line 210 that are separated by repair pattern 221, and unit filter bank 231 is connected in parallel to repair pattern 221. Unit filter banks 231, 233, 235, and 237 may all have the same inductance or may not all have the same inductance. In addition, unit filter banks 231, 233, 235, and 237 all have the same pattern.

First line width W1 of filter distribution line 210 may be the same as the respective line widths of distribution lines 185, 186, and 187. In addition, if, for example, the line width of an input distribution line 186 is greater than the line width of an output distribution line 185, first line width W1 may be the same as the line width of the output distribution line 185. Second line width W2 of repair patterns 221, 223, 225, and 227 may be equal to a line width that is substantially the smallest line width with which a line can be formed by the fabrication processes for fabricating tape distribution substrates 130 and 160. In accordance with the embodiment illustrated in FIG. 3, if first line width W1 of filter distribution line 210 is narrow enough to be cut by a laser or a mechanical drill, second line width W2 may be less than or equal to first line width W1.

Referring to FIGS. 2 and 3, when filter 200 is disposed adjacent to input distribution lines 186, first end portion 211 of filter distribution line 210 is electrically connected to one of PCBs 120 (i.e., source PCB 125) and second end portion 212 of filter distribution line 210 is electrically connected to semiconductor chip 170 (of FIG. 1) when mounted. When filter 200 is disposed adjacent to output distribution lines 185, first end portion 211 is electrically connected to semiconductor chip 170 when mounted and second end portion 212 is electrically connected to display panel 110. When filter 200 is disposed adjacent to at least one bypass distribution line 187, first end portion 211 is electrically connected to one of PCBs 120 (i.e., source PCB 125) and second end portion 212 is electrically connected to display panel 110.

Repair patterns 221, 223, 225, and 227 of repair portion 220 are cutable. As used herein, when a repair pattern is said to be "cutable" it means that the repair pattern can be cut (i.e., is adapted to be cut) using a laser 240 or a mechanical drill. The number of repair patterns that filter 200 comprises and the respective inductances of unit bank filters 231, 233, 235, and 237 of filter 200 can be adjusted in order to reduce the level of EMI of display panel assembly 100 and to optimize operational properties of semiconductor chip 170.

Figure 4A:
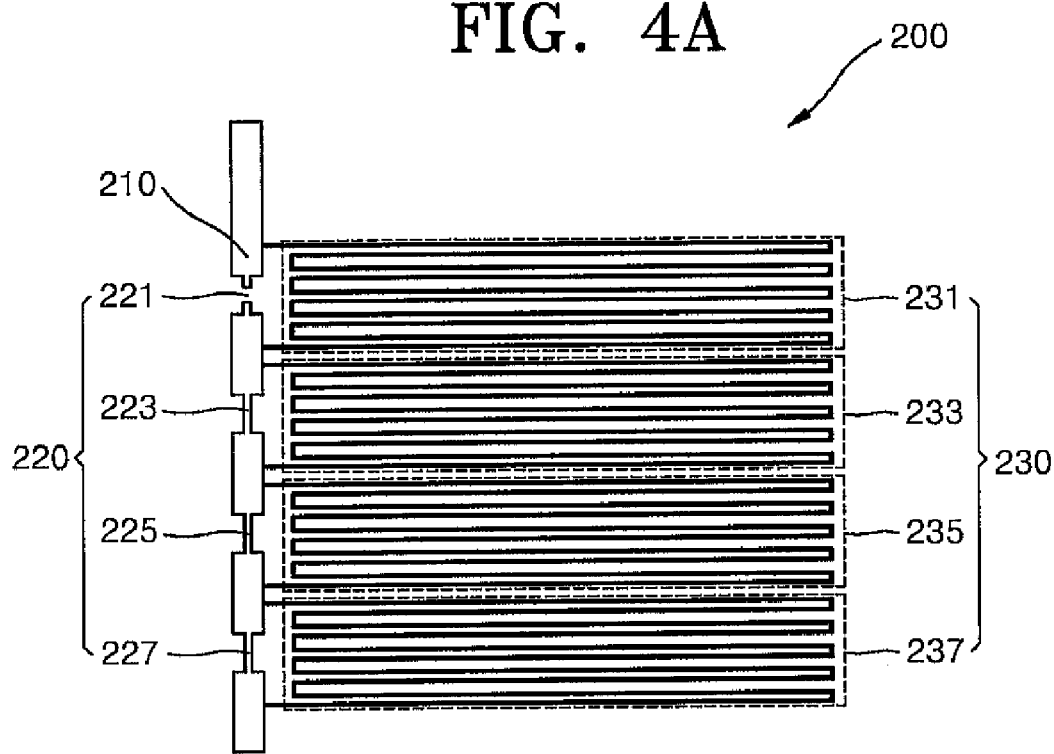
FIGS. 4A through 4D illustrate the AI filter of FIG. 3 in various repair pattern states.
Figure 4B:
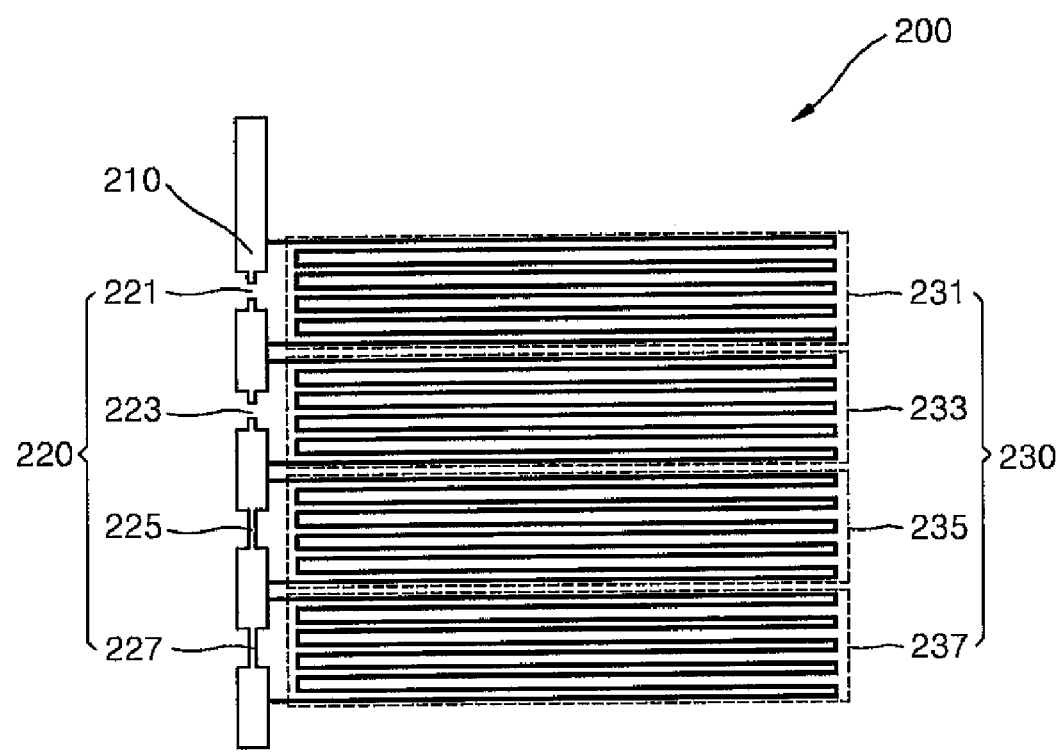
Figure 4C:
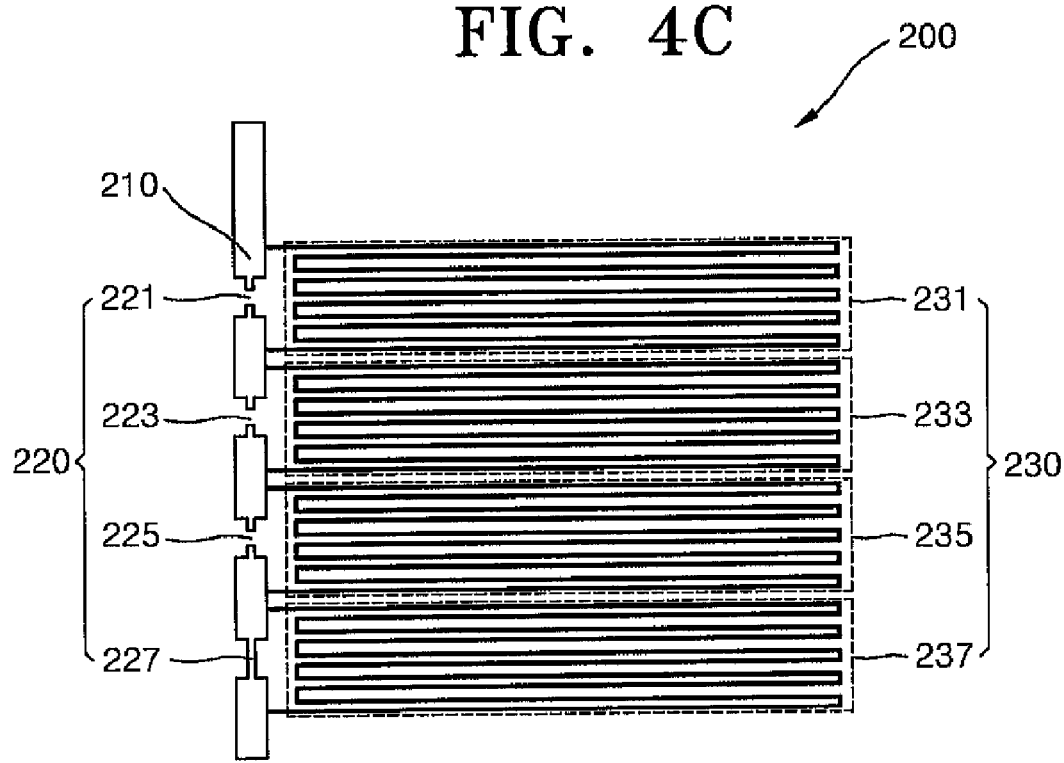
Figure 4D:
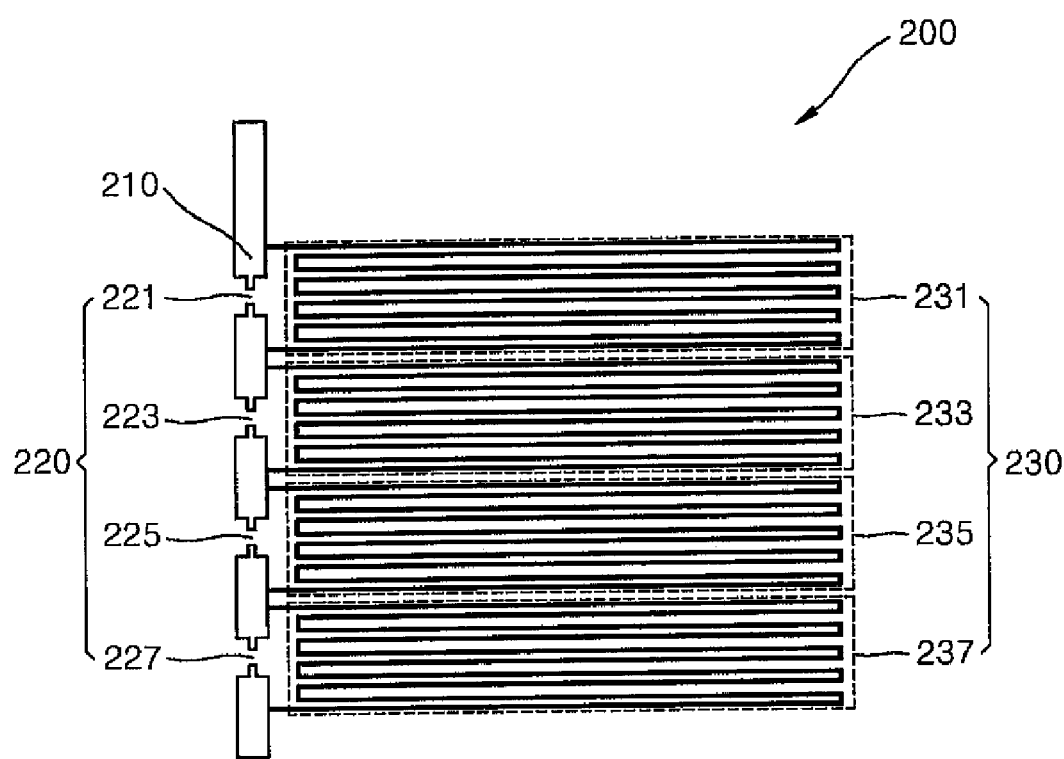
Figure 5A:
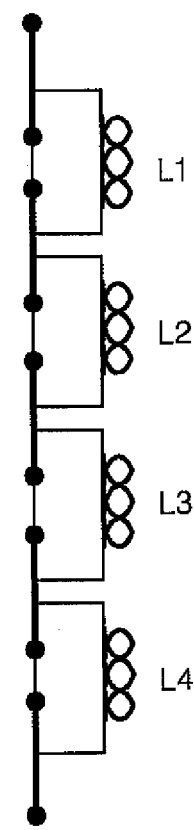
FIGS. 5A and 5B are equivalent circuit diagrams of the AI filter of FIG. 3 in two different repair pattern states.
Figure 5B:
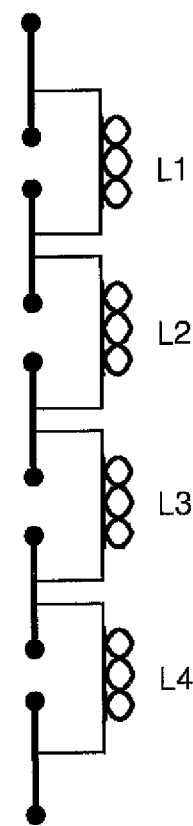
Figure 6A:
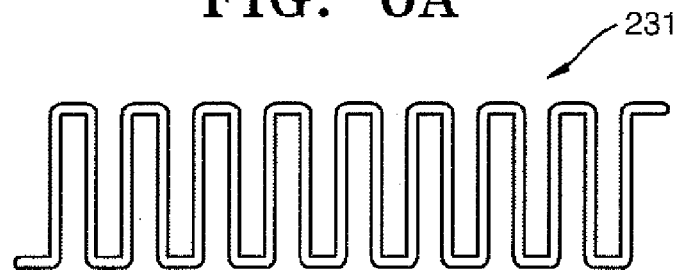
FIGS. 6A through 6E illustrate, in accordance with embodiments of the invention, examples of types of patterns that a unit filter bank of the AI filter of FIG. 3 may have.
Figure 6B:
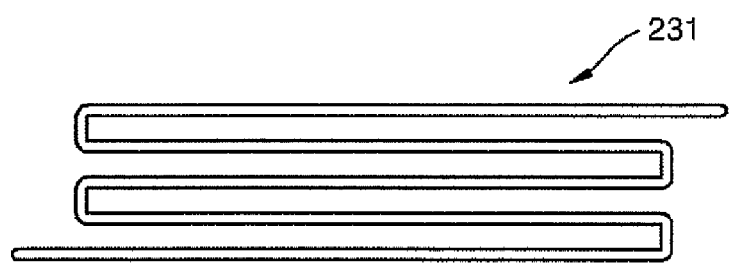
Figure 6C:
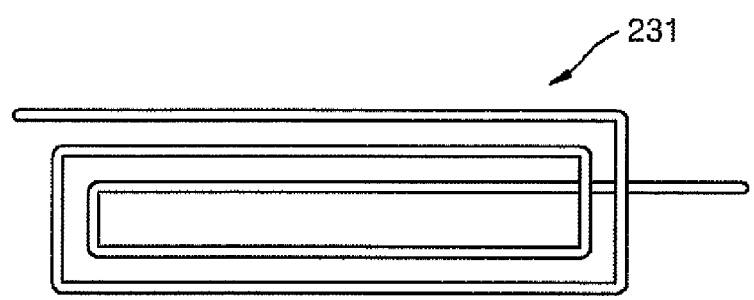
Figure 6D:
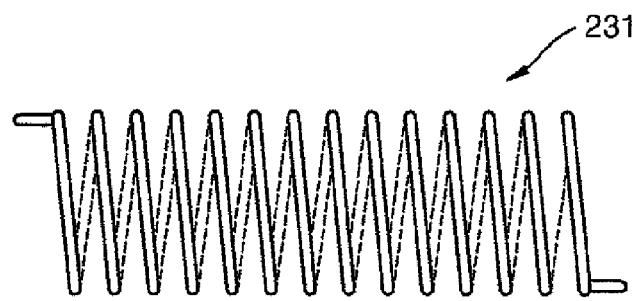
Figure 6E:
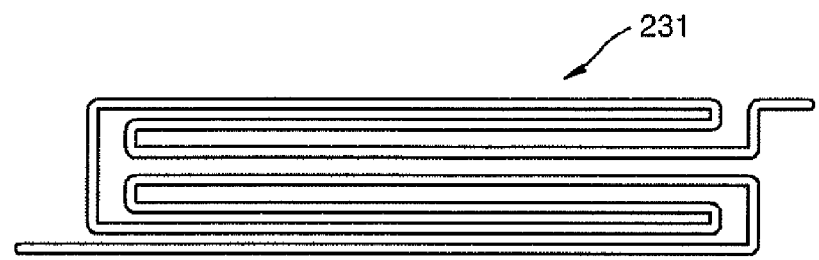

FIGS. 4A through 4D illustrate filter 200 of FIG. 3 in various repair pattern states. FIGS. 5A and 5B are equivalent circuit diagrams of filter 200 in two different repair pattern states, wherein filter 200 has a different inductance in each of the two repair pattern states illustrated. As used herein, a "repair pattern state" of a filter 200 refers to the condition of each of the repair patterns of filter 200, wherein the "condition" of a repair pattern is either cut or not cut. For example, filter 200 of FIG. 4A has a different repair pattern state than filter 200 of FIG. 4B because repair pattern 223 is cut in filter 200 of FIG. 4B while it is not cut in filter 200 of FIG. 4A.

For purposes of description with reference to FIGS. 4 and 5, it will be assumed that the inductance of filter distribution line 210 is Lt; the respective inductances of unit bank filters 231, 233, 235, and 237 are L1, L2, L3, and L4; and Lt is less than each of L1 through L4. Filter distribution line 210 (i.e., Lt) may have a relatively small inductance that is within a range of inductance values that have no substantial effect on the transmission of a signal from PCBs 120 (i.e., from source PCB 125) to semiconductor chip 170, the transmission of a signal from semiconductor chip 170 to display panel 110, or the transmission of a signal from PCBs 120 (i.e., from source PCB 125) to display panel 110. That is, filter distribution line 210 may have an inductance of 0.1 nH or less.

FIG. 5A illustrates an equivalent circuit for filter 200 when none of repair patterns 221, 223, 225, and 227 of repair portion 220 is cut. When none of repair patterns 221, 223, 225, and 227 of repair portion 220 is cut, the inductance of filter 200 ($L_{tot}$) is Lt. When only first repair pattern 221 of the repair patterns is cut (as shown in FIG. 4A) the inductance of filter 200 ($L_{tot}$) is the sum of Lt and the inductance of first unit filter bank 231 (L1), which is $L_{tot}$=Lt+L1. When only first and second repair patterns 221 and 223 are cut (as shown in FIG. 4B), the inductance of filter 200 ($L_{tot}$) is the sum of the inductance of filter distribution line 210 (Lt) and the respective inductances of first and second unit filter banks 231 and 233 (L1 and L2, respectively), which is $L_{tot}$=Lt+L1+L2. When only first, second, and third repair patterns 221, 223, and 225 are cut (as shown in FIG. 4C), the inductance of filter 200 ($L_{tot}$) is the sum of the inductance of filter distribution line 210 (Lt) and the respective inductances of first, second, and third unit filter banks 231, 233, and 235 (L1, L2, and L3, respectively), which is $L_{tot}$=Lt+L1+L2+L3. In addition, when all of repair patterns 221, 223, 225, and 227 are cut (as shown in FIG. 4D), the inductance of filter 200 ($L_{tot}$) is the sum of the inductance of filter distribution line 210 (Lt) and the respective inductances of first, second, third, and fourth unit filter banks 231, 233, 235, and 237 (L1, L2, L3, and L4, respectively), which is $L_{tot}$=Lt+L1+L2+L3+L4. FIG. 5B illustrates an equivalent circuit for filter 200 when all of repair patterns 221, 223, 225, and 227 are cut.

Therefore, the inductance of filter 200 may be adjusted in accordance with the level of EMI generated by display panel assembly 100 (in order to reduce the level of EMI generated by display panel assembly 100) by selectively cutting repair patterns 221, 223, 225, and 227 of filter 200. Thus, the level of EMI generated can be reduced effectively. Filter 200 can be adjusted to have an inductance within a range of 10 nH to 150 nH. Filter 200 is designed not to affect the operational properties of a corresponding semiconductor chip, and is designed to have an inductance value that may be adjusted in accordance with the level of EMI generated by display panel assembly 100.

FIGS. 6A through 6E illustrate, in accordance with embodiments of the invention, examples of types of patterns that unit filter bank 231 of filter bank portion 230 of filter 200 may have. Though FIGS. 6A through 6E illustrate examples of types of patterns that unit filter bank 231 may have, any one of unit filter banks 233, 235, and 237 may also have a pattern corresponding to any one of the examples illustrated in FIGS. 6A through 6E. As illustrated in FIGS. 6A through 6E, unit filter bank 231 (and also any one of unit filter banks 233, 235, and 237) may have a meander-type pattern (see FIGS. 6A, 6B, and 6E), a spiral-type pattern (see FIG. 6C), or a solenoid-type pattern (see FIG. 6D). In addition, unit filter banks 231, 233, 235, and 237 may all have the same pattern or may not all have the same pattern. Filter 200 may be formed as distribution patterns 180 of source tape distribution substrate 160 are patterned and may subsequently be incorporated into (i.e., built into) source tape distribution substrate 160. Thus, the process for fabricating source tape distribution substrate 160 may be relatively simple.

Figure 7:
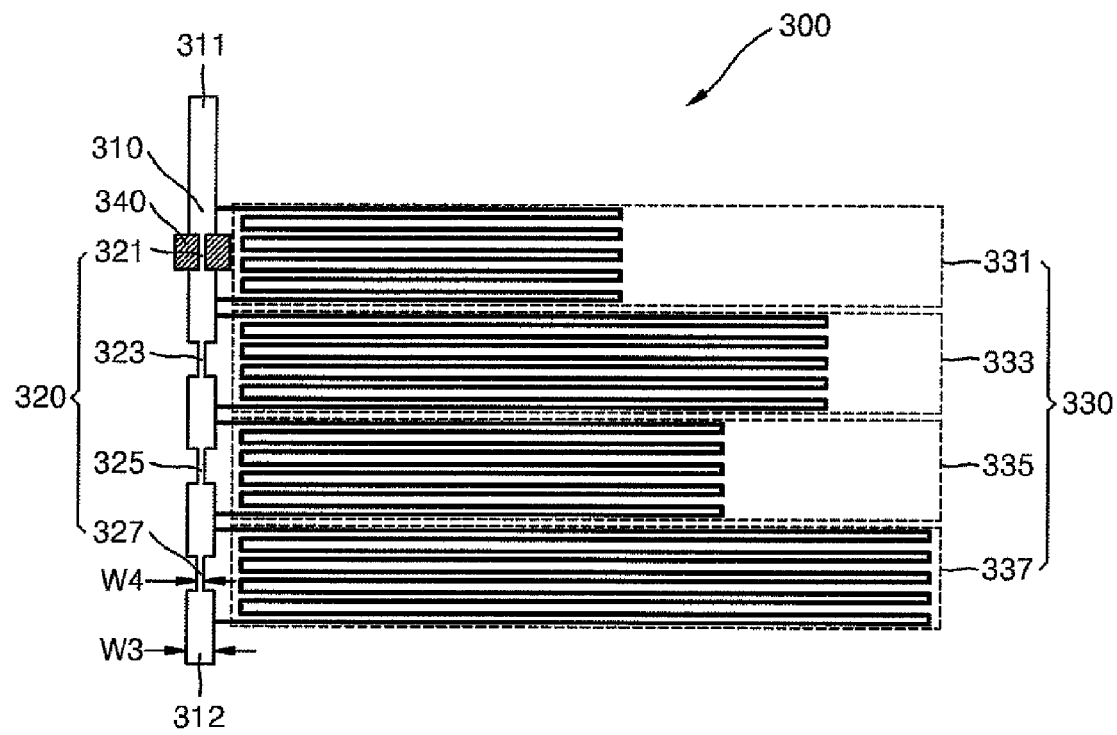
FIG. 7 is a plan view of an AI filter in accordance with another embodiment of the invention; and, FIGS. 8A and 8B are graphs illustrating results of simulations of the EMI characteristic of a display panel comprising an AI filter in accordance with an embodiment of the invention.

FIG. 7 is a plan view of an EMI reduction filter 300 (which may be referred to hereinafter as simply "filter" 300) in accordance with an embodiment of the invention. Referring to FIG. 7, filter 300 comprises a filter distribution line 310 comprising a first end portion 311 and a second end portion 312, a repair portion 320 disposed between first and second end portions 311 and 312 of filter distribution line 310, and a filter bank portion 330 connected to filter distribution line 310. Repair portion 320 comprises repair patterns 321, 323, 325, and 327, which are disposed between first and second end portions 311 and 312 of filter distribution line 310. At least portions of filter distribution line 310 have a first line width W3. That is, at least the portions of filter distribution line 310 other than repair patterns 321, 323, 325, and 327 have first line width W3. Repair patterns 321, 323, 325, and 327 each have a second line width W4. So, in the embodiment illustrated in FIG. 7, unless second line width W4 is equal to first line width W3, all portions of filter distribution line 310 except for repair patterns 321, 323, 325, and 327 have first line width W3. Filter bank portion 330 comprises unit filter banks 331, 333, 335, and 337 connected to filter distribution line 310. Each of unit filter banks 331, 333, 335, and 337 is connected to (i.e., connected electrically between) a respective two portions of filter distribution line 310 separated by one of repair patterns 321, 323, 325, and 327. In addition, unit filter banks 331, 333, 335, and 337 are connected in parallel to repair patterns 321, 323, 325, and 327, respectively.

First line width W3 of filter distribution line 310 may be the same as the respective line widths of distribution lines 185, 186, and 187 (see FIG. 2). In addition, if, for example, the line width of an input distribution line 186 is greater than the line width of an output distribution line 185, first line width W3 may be the same as the line width of output distribution line 185. Second line width W4 of repair patterns 321, 323, 325, and 327 may be equal to a line width that is substantially the smallest line width with which a line can be formed by the fabrication processes for fabricating tape distribution substrates 130 and 160. In accordance with the embodiment illustrated in FIG. 7, if first line width W3 of filter distribution line 310 is narrow enough to be cut by a laser 340 or a mechanical drill, second line width W4 may be less than or equal to first line width W3.

Filter bank portion 330 comprises a plurality of unit filter banks 331, 333, 335, and 337, wherein unit filter banks 331, 333, 335, and 337 have different inductances than one another. In the embodiment illustrated in FIG. 7, unit filter banks 331, 333, 335, and 337 each have a meander-type pattern with a different length, so unit filter banks 331, 333, 335, and 337 have different inductances than one another. Alternatively, filter bank portion 330 may comprise, for example, unit filter banks 331, 333, 335, and 337 wherein each of the unit filter banks has a pattern selected from among the examples shown in FIGS. 6A through 6E and not all of the unit filter banks have the same pattern. When not all of unit filter banks 331, 333, 335, and 337 have the same pattern, the unit filter banks may all have the same inductance or not.

Referring to FIGS. 2 and 7, when filter 300 is disposed adjacent to input distribution lines 186 on source tape distribution substrate 160 of FIG. 2, first end portion 311 of filter distribution line 310 is electrically connected to source PCB 125 and second end portion 312 of filter distribution line 310 is electrically connected to semiconductor chip 170. When filter 300 is disposed adjacent to output distribution lines 185, first end portion 311 of filter distribution line 310 is electrically connected to semiconductor chip 170, and second end portion 312 of filter distribution line 310 is electrically connected to display panel 110. In addition, when filter 300 is disposed adjacent to bypass distribution lines 187, first end portion 311 of filter distribution line 310 is electrically connected to source PCB 125 and second end portion 312 of filter distribution line 310 is electrically connected to display panel 110.

Figure 8A:
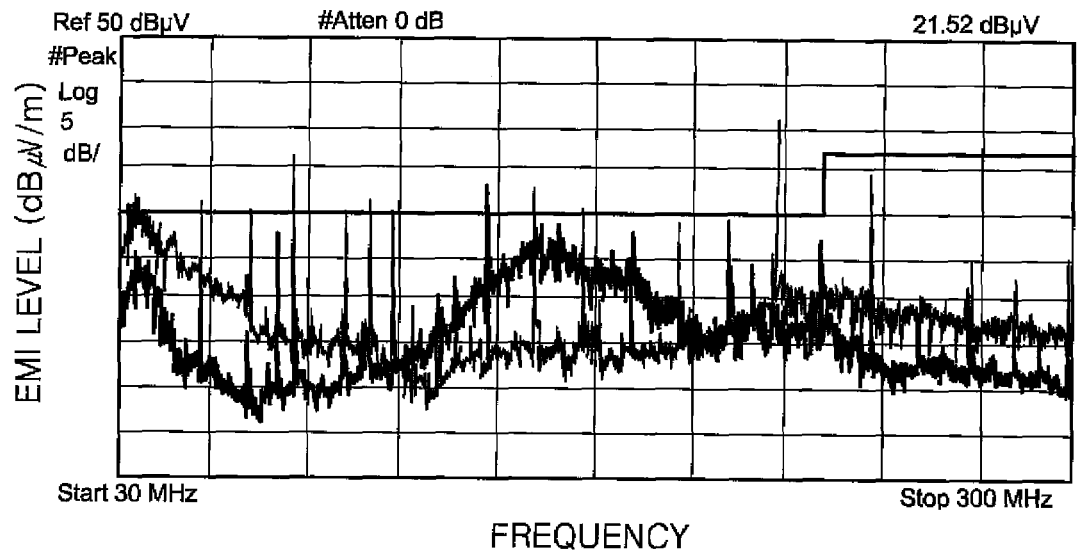
Figure 8B:
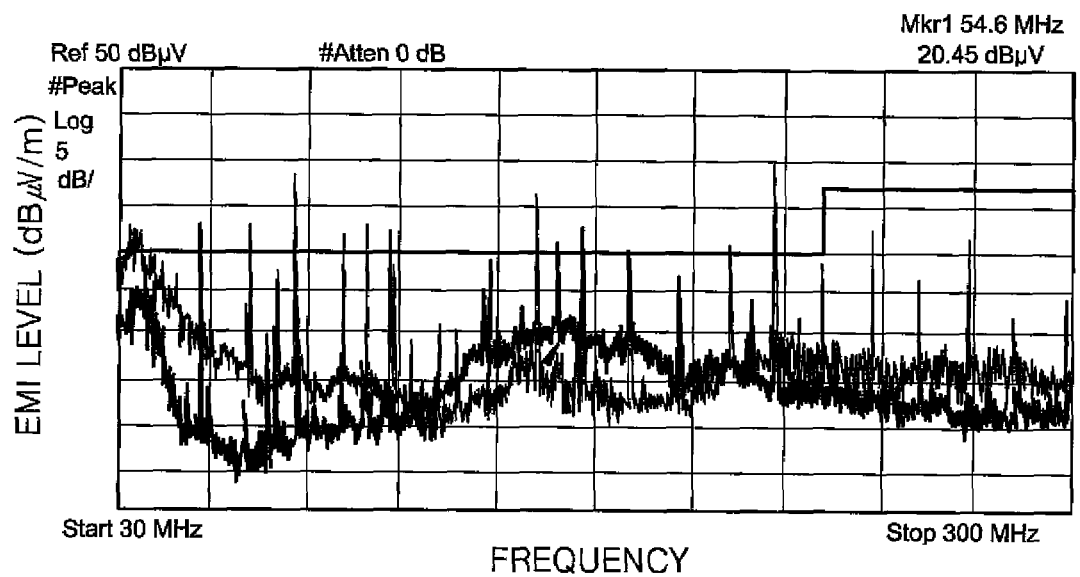

FIGS. 8A and 8B are graphs illustrating results of simulations of the EMI characteristic of a display panel assembly comprising an AI filter in accordance with an embodiment of the invention. FIG. 8A illustrates the EMI characteristic of the display panel assembly before adjusting the inductance of (i.e., repairing) the AI filter, and FIG. 8B illustrates the EMI characteristic of the display panel assembly after adjusting the inductance of (i.e., repairing) the AI filter. In FIGS. 8A and 8B, EMI within a frequency range of 30 MHz to 300 MHz is simulated, and the y-axis of each of the graphs represents EMI level, wherein, in each graph, the y-axis shows EMI level ranging from 0 to 50 dB and the y-axis is marked in intervals of 5 dB. Referring to FIGS. 8A and 8B, the EMI level of the display panel assembly is reduced after adjusting the inductance of the AI filter.

When an AI filter in accordance with an embodiment of the invention is incorporated into a tape distribution substrate, the level of EMI generated by a display panel assembly can be reduced effectively while maintaining the operational properties of a driving integrated circuit (IC) by adjusting the inductance of the filter in accordance with the level of EMI generated by the display panel assembly.

In addition, in accordance with an embodiment of the invention, the inductance of the filter can be adjusted in order to reduce the level of EMI generated by the display panel assembly by cutting one or more repair patterns of the filter and without changing the design of the tape distribution substrate. Therefore, in accordance with an embodiment of the invention, the fabrication costs of the display panel assembly may be reduced, and the size of the display panel assembly may also be reduced.

Although embodiments of the invention have been described herein with reference to the accompanying drawings, changes may be made to the embodiments by one of ordinary skill in the art without departing from the scope of the invention as defined by the accompanying claims.

What is claimed is:

1. An adjustable-inductance (AI) filter comprising:
   a filter distribution line terminating in first and second end portions each having a first line width;
   a plurality of repair patterns, each having a second line width, the plurality of repair patterns being disposed in a row along the length of the filter distribution line between the first and second end portions; and,
   plurality of unit filter banks, each being respectively connected in parallel with one of the plurality of repair patterns.

2. The AI filter of claim 1, wherein each unit filter bank in the plurality of unit filter banks has one of a meander-type pattern, a spiral-type pattern, and a solenoid-type pattern.

3. The AI filter of claim 2, wherein each unit filter bank has the same pattern.

4. The AI filter of claim 2, wherein each unit filter bank has the same inductance.

5. The AI filter of claim 1, wherein each unit filter bank has the same pattern and the same inductance.

6. The AI filter of claim 1, wherein:
   not all of the plurality of unit filter banks have the same pattern; and,
   not all of the plurality of unit filter banks have the same inductance.

7. The AI filter of claim 1, wherein the second line width is less than or equal to the first line width.

8. The AI filter of claim 1, wherein at least one of the plurality of repair patterns is cutable.

9. A tape distribution substrate comprising:
   a base film comprising a chip mounting portion;
   a semiconductor chip mounted on the chip mounting portion;
   distribution patterns disposed on the base film; and,
   an adjustable-inductance (AI) filter disposed on the base film and disposed adjacent to at least one of the distribution patterns,
   wherein the AI filter comprises:
      a filter distribution line comprising first and second end portions each having a first line width;
      a repair portion disposed between the first and second end portions; and,
      a filter bank portion connected to the first and second end portions.

10. The tape distribution substrate of claim 9, wherein the distribution patterns comprise:
    a plurality of input distribution lines disposed on the base film and connected to the semiconductor chip;
    a plurality of output distribution lines disposed on the base film and connected to the semiconductor chip; and
    a plurality of bypass distribution lines disposed on the base film.

11. The tape distribution substrate of claim 10, wherein the AI filter is disposed adjacent to at least one of the input distribution lines, one of the output distribution lines, or one of the bypass distribution lines.

12. The tape distribution substrate of claim 9, wherein:
    the repair portion comprises a plurality of repair patterns, each having a second line width; and,
    the filter bank portion comprises a plurality of unit filter banks, each respectively connected in parallel with a corresponding one of the plurality of repair patterns.

13. The tape distribution substrate of claim 12, wherein each unit filter bank in the plurality of unit filter banks has one of a meander-type pattern, a spiral-type pattern, and a solenoid-type pattern.

14. The tape distribution substrate of claim 13, wherein each unit filter bank has the same pattern.

15. The tape distribution substrate of claim 13, wherein each unit filter bank has the same inductance.

16. The tape distribution substrate of claim 12, wherein each unit filter bank has the same pattern and the same inductance.

17. The tape distribution substrate of claim 12, wherein:
not all of the plurality of unit filter banks have the same pattern; and,
not all of the plurality of unit filter banks have the same inductance.

18. The tape distribution substrate of claim 12, wherein the second line width is less than or equal to the first line width.

19. The tape distribution substrate of claim 12, wherein at least of the plurality of repair patterns is cutable.

20. A display panel assembly comprising:
a display panel;
a printed circuit board supplying driving signals to the display panel; and,
a tape distribution substrate connected between the printed circuit board and the display panel and comprising an adjustable-inductance (Al) filter,
wherein the Al filter comprises:
a filter distribution line comprising first and second end portions each having a first line width;
a plurality of repair patterns, each having a second line width and being disposed along the filter distribution line between the first and second end portions; and,
a plurality of unit filter banks, respectively connected in parallel with one of the plurality of repair patterns.

21. The display panel assembly of claim 20, wherein the tape distribution substrate comprises:
a base film comprising a chip mounting portion;
a semiconductor chip mounted on the chip mounting portion;
a plurality of input distribution lines, and a plurality of output distribution lines disposed on the base film and connected to the semiconductor chip; and,
a plurality of bypass distribution lines disposed on the base film,
wherein the Al filter is disposed on the base film proximate to at least one of the plurality of input distribution lines, one of the plurality of output distribution lines, and one of the plurality of bypass distribution lines.

22. The display panel assembly of claim 20, wherein each one of the plurality of unit filter banks has one of a meander-type pattern, a spiral-type pattern, and a solenoid-type pattern.

23. The display panel assembly of claim 22, wherein each unit filter bank has the same pattern and the same inductance.

24. The display panel assembly of claim 22, wherein:
not all of the plurality of unit filter banks have the same pattern; and,
not all of the plurality of unit filter banks have the same inductance.

25. The display panel assembly of claim 20, wherein the second line width is less than or equal to the first line width.

26. The display panel assembly of claim 20, wherein least one of the plurality of repair patterns is cutable.

* * * * *